(12) United States Patent
Zhou et al.

(10) Patent No.: US 8,853,348 B2
(45) Date of Patent: Oct. 7, 2014

(54) CONJUGATED POLYMER CONTAINING DITHIENOPYRROLE-QUINOXALINE, PREPARATION METHOD AND USES THEREOF

(75) Inventors: Mingjie Zhou, Guangdong (CN); Jie Huang, Guangdong (CN); Erjian Xu, Guangdong (CN)

(73) Assignee: Ocean's King Lighting Science & Technology Co., Ltd., Guangdong (CN)

( * ) Notice: Subject to any disclaimer, the term of this patent is extended or adjusted under 35 U.S.C. 154(b) by 0 days.

(21) Appl. No.: 13/699,380

(22) PCT Filed: May 21, 2010

(86) PCT No.: PCT/CN2010/073036
§ 371 (c)(1),
(2), (4) Date: Nov. 21, 2012

(87) PCT Pub. No.: WO2011/143825
PCT Pub. Date: Nov. 24, 2011

(65) Prior Publication Data
US 2013/0066043 A1 Mar. 14, 2013

(51) Int. Cl.
| | | |
|---|---|---|
| *C08G 75/00* | (2006.01) | |
| *C09B 69/10* | (2006.01) | |
| *H01L 51/00* | (2006.01) | |
| *C08G 61/12* | (2006.01) | |
| *B82Y 10/00* | (2011.01) | |
| *C09K 11/06* | (2006.01) | |
| *H01L 51/42* | (2006.01) | |

(52) U.S. Cl.
CPC .... *H01L 51/0043* (2013.01); *C09K 2211/1466* (2013.01); *C09B 69/109* (2013.01); *C09K 2211/1416* (2013.01); *H01L 51/0035* (2013.01); *C09K 2211/1425* (2013.01); *H01L 51/4253* (2013.01); *C08G 61/122* (2013.01); *C08G 2261/92* (2013.01); *Y02E 10/549* (2013.01); *C08G 2261/124* (2013.01); *C08G 2261/3243* (2013.01); *C08G 2261/1412* (2013.01); *C08G 61/124* (2013.01); *B82Y 10/00* (2013.01); *C09K 11/06* (2013.01); *C08G 61/126* (2013.01); *H01L 51/0047* (2013.01); *H01L 51/0036* (2013.01); *C08G 2261/91* (2013.01); *C08G 2261/95* (2013.01); *C08G 2261/3241* (2013.01); *C09K 2211/1458* (2013.01)

USPC ............ 528/377; 528/378; 528/380; 136/263; 428/690; 564/426; 549/41; 549/456; 549/160; 549/349; 549/331; 252/301.16

(58) Field of Classification Search
USPC ............ 136/263; 428/690; 528/377, 378, 380; 564/426; 549/41, 456, 160, 349, 331; 252/301.16
See application file for complete search history.

(56) References Cited

U.S. PATENT DOCUMENTS

2008/0262183 A1* 10/2008 Lehmann ................. 528/7

OTHER PUBLICATIONS

Yamamoto (Chemistry Letters, pp. 1709-1712, 1994).*

*Primary Examiner* — Shane Fang
(74) *Attorney, Agent, or Firm* — Ross Barnes LLP; Monty L. Ross; Robin L. Barnes

(57) ABSTRACT

A conjugated polymer containing dithienopyrrole-quinoxaline, the preparation method and uses thereof are provided. The structural formula of the polymer is general formula (I) as follows: wherein, x+y=1, 0<y≤0.5, n is an integer and 1<n≤100, $R_1$ is selected from $C_1$ to $C_{20}$ alkyl group, and $R_2$ and $R_3$ are selected from —H, $C_1$ to $C_{20}$ alkyl group, $C_1$ to $C_{20}$ alkoxyl group, alkyl-containing phenyl group, alkyl-containing fluorenyl group, or alkyl-containing carbazyl group. The polymer can be used for polymer solar cells and the like.

2 Claims, 2 Drawing Sheets

CONJUGATED POLYMER CONTAINING DITHIENOPYRROLE-QUINOXALINE, PREPARATION METHOD AND USES THEREOF

TECHNICAL FIELD

This invention relates to the technical field of synthesize of organic compound, particularly, to a conjugated polymer containing dithienopyrrole-quinoxaline, the preparation method and use thereof.

BACKGROUND

It is a hot issue and difficult point in the photovoltaic field to make low cost and high efficient solar cell from cheap material. Nowadays, the application of the silicon solar cell module for ground is restricted by its complicated manufacture process and high cost. In order to reduce the cost and expand the extent of application, new material for solar cell has long been looked for. Polymer solar cell has been focused on because of the advantages of raw material with low cost, the cell having lightweight, flexibility, easy to produce, and may be produced in a large area by coating and printing. And the polymer solar cell will have a large market prospect if the energy conversion efficiency thereof can be increased to the level close to that of commercial available silicon solar cell. In 1992, N. S. Sariciftci et al reported in SCIENCE the phenomenon that the light induced electron may be transferred between a conjugated polymer and the $C_{60}$, since then, a lot of research about the polymer solar cell has been carried out, and has an increasing development. At present, the research about polymer solar cell is mainly focused on the donor-acceptor blends, among others the energy conversion efficiency of the PTB7 and $PC_{71}BM$ blend has been increased to 7.4%, which is still much lower than that of inorganic solar cell. The main factors that limit the improving of performance of the organic solar cell are: the relatively low carrier mobility of the organic semiconductor element, the spectral response of the element not matching the solar radiation spectrum, the red light region with high photon flux not being effectively utilized and the low carrier collecting efficiency of the electrode and the like. To make practical use of the polymer solar cell, the development of new type of material and significantly increasing of its energy conversion efficiency is still the primary task in this field.

SUMMARY

A technical problem solved by the present invention is to provide a conjugated polymer containing dithienopyrrole-quinoxaline, which has an effectively extended conjugacy, a lower band gap, and facilitates the transfer of carrier between two main chains, thereby improves the mobility of the carrier, meanwhile, the process of introducing electron donator and electron acceptor is simplified, thus the characteristic of electron withdrawing of the polymer is modulated.

Another object of the present invention is to provide a preparation method of a conjugated polymer containing dithienopyrrole-quinoxaline, which is simple, has high yield, and easy to operate and control.

A further object of the present invention is to provide a use of the above-mentioned conjugated polymer containing dithienopyrrole-quinoxaline in the field of organic photoelectric material, polymer solar cell, organic electroluminescent device, organic field effect transistor, organic optical storage, organic nonlinear material and/or organic laser.

The above-mentioned technical problems can be solved through the following technical solutions: a conjugated polymer containing dithienopyrrole-quinoxaline, the general formula (I) thereof is:

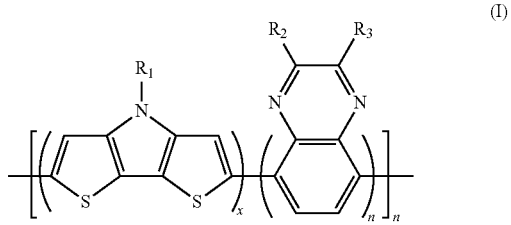

(I)

Wherein, x+y=1, 0<y≤0.5, n is an integer and 1<n≤100, $R_1$ is selected from $C_1$~$C_{20}$ alkyl, $R_2$ and $R_3$ are independently selected from the group consisting of —H, $C_1$~$C_{20}$ alkyl, $C_1$~$C_{20}$ alkoxyl, benzene ring group containing alkyl, fluorenyl group containing alkyl and carbazyl group containing alkyl.

And a method for manufacturing a conjugated polymer containing dithienopyrrole-quinoxaline, comprising:

Compounds A, B, C with following structural formulae respectively are provided,

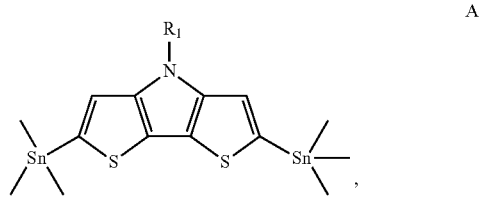

A

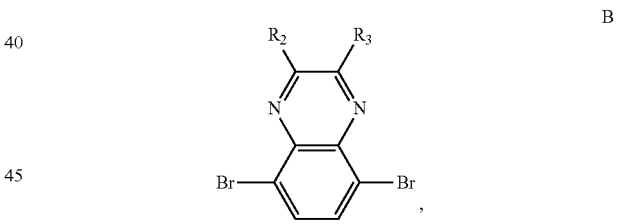

B

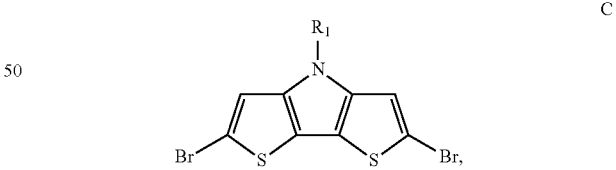

C wherein, $R_1$ is selected from $C_1$~$C_{20}$ alkyl, $R_2$ and $R_3$ are independently selected from the group consisting of —H, $C_1$~$C_{20}$ alkyl, $C_1$~$C_{20}$ alkoxyl, benzene ring group containing alkyl, fluorenyl group containing alkyl and carbazyl group containing alkyl;

under oxygen-free environment and with the present of catalyst and organic solvent, Stille coupling of compounds A, B, C in a molar ratio of m:p:q is performed to give a conjugated polymer containing dithienopyrrole-quinoxaline represented by general structural formula (I), wherein, m=p+q, and m>q≥0,

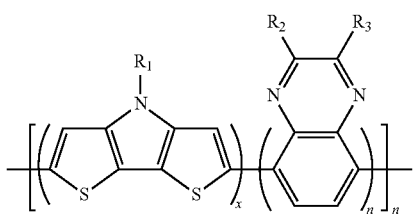

in the general formula (I), x+y=1, 0<y≤0.5, n is an integer and 1<n≤100.

Furthermore, the application of the conjugated polymer containing dithienopyrrole-quinoxaline according to the present invention in the field of organic photoelectric material, polymer solar cell, organic electroluminescent device, organic field effect transistors, organic optical storage, organic nonlinear material and/or organic laser is provided.

The major advantage of the present invention compared to the prior art is as follows:

1. the N-alkyl dithieno [3,2-b: 2',3'-d] pyrrole structural unit in the conjugated polymer containing dithienopyrrole-quinoxaline has a completely plane crystal structure, wherein two thiophene rings thereof are in the same plane, thus the conjugate of the polymer of the present invention is extended effectively, and the band gap of the polymer is lowered, so as to facilitate the transfer of carrier between two main chains, and improve the mobility of carrier;

2. meanwhile the quinoxaline structural unit thereof is a good acceptor unit with strong electron withdrawing, the present of this quinoxaline structural unit endows the polymer of the present invention with high electron mobility, high glass transition temperature, superior electrochemistry reducibility, on the other hand this quinoxaline structural unit has good modifiability, which makes the introduction of electron donator and electron acceptor to the polymer of the present invention easily and the electron withdrawing of the polymer may be improved;

3. As the conjugated polymer containing dithienopyrrole-quinoxaline comprises both N-alkyl dithieno [3,2-b: 2',3'-d] pyrrol and quinoxaline structural units, the application of the polymer in the field of organic photoelectricity material, polymer solar cell, organic electroluminescent device, organic field effect transistors, organic optical storage, organic nonlinear material and/or organic laser is extended;

4. the process of producing the conjugated polymer containing dithienopyrrole-quinoxaline is simple, and has a high yield, the reacting condition thereof is mild, easy to operate and control, and suitable for industrial production.

DETAILED DESCRIPTION OF THE PREFERRED EMBODIMENTS

Objects, advantages and embodiments of the present invention will be explained below in detail with reference to the embodiments. However, it is to be appreciated that the following description of the embodiments is merely exemplary in nature and is no way intended to limit the invention, its application, or uses.

Figure 1:
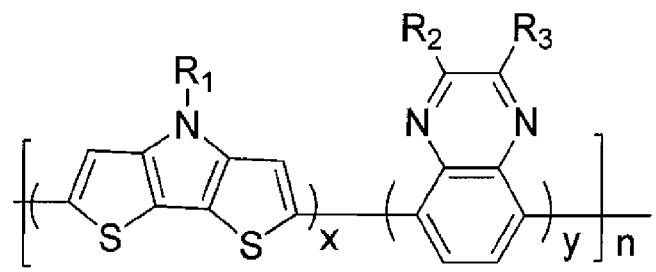
FIG. 1 is a schematic view of the general formula of the conjugated polymer containing dithienopyrrole-quinoxaline according to the embodiments of the present invention.

Referring to FIG. 1, a conjugated polymer containing dithienopyrrole-quinoxaline according to the embodiments of the present invention is shown, the general structural formula (I) thereof is:

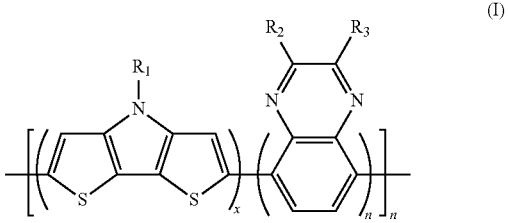

wherein, x+y=1, 0<y≤0.5, n is an integer and 1<n≤100, $R_1$ is selected from $C_1$~$C_{20}$ alkyl, $R_2$ and $R_3$ are independently selected from the group consisting of —H, $C_1$~$C_{20}$ alkyl, $C_1$~$C_{20}$ alkoxyl, benzene ring group containing alkyl, fluorenyl group containing alkyl and carbazyl group containing alkyl.

The general structural formula of the above benzene ring group containing alkyl is preferably as follows:

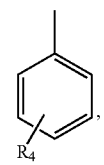

wherein $R_4$ is preferably selected from the group consisting of $C_1$~$C_{15}$ alkyl and $C_1$~$C_{15}$ alkoxyl.

The general structural formula of the above fluorenyl group containing alkyl is preferably as follows:

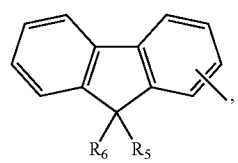

wherein $R_5$ and $R_6$ are the same or different, and preferably, they are independently $C_1$~$C_{15}$ alkyl.

The general structural formula of the above carbazyl group containing alkyl is preferably as follows:

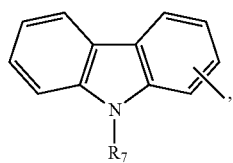

wherein, $R_7$ is preferably $C_1$~$C_{15}$ alkyl.

The N-alkyl dithieno [3,2-b: 2',3'-d] pyrrole structural unit in the conjugated polymer containing dithienopyrrole-quinoxaline has a completely plane crystal structure, wherein two thiophene rings thereof are in the same plane, thus the conjugate of the polymer of the present invention is extended effectively, and the band gap of the polymer is lowered, so as to facilitate the transfer of carrier between two main chains, and improve the mobility of carrier; meanwhile the quinoxaline structural unit thereof is a good acceptor unit with strong electron withdrawing, the present of this quinoxaline structural unit endows the polymer of the present invention with high electron mobility, high glass transition temperature, superior electrochemistry reducibility, on the other hand this quinoxaline structural unit has good modifiability, which makes the introduction of electron donator and electron acceptor to the polymer easily and the electron withdrawing of the polymer may be improved;

Also, the embodiment of the present invention also provides a method of manufacturing a conjugated polymer containing dithienopyrrole-quinoxaline, comprising a chemical equation as follows:

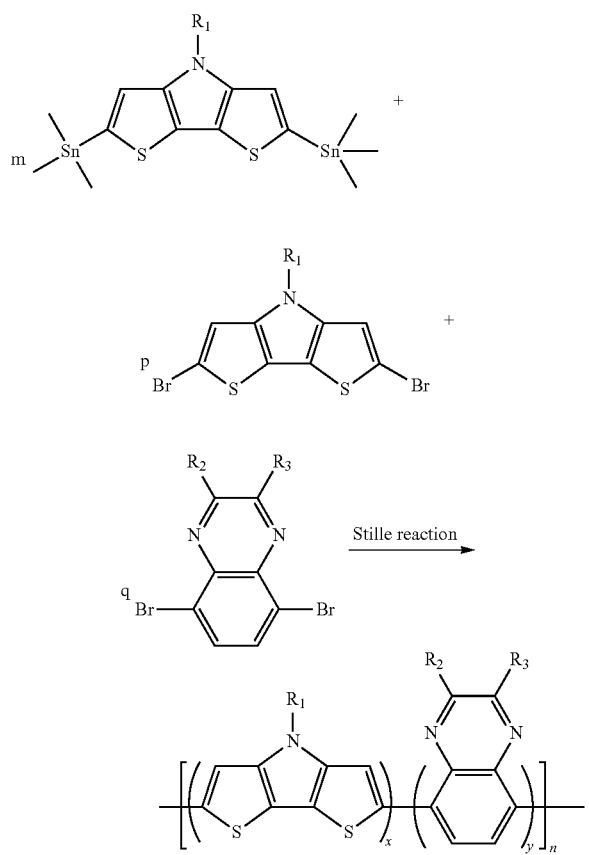

The detailed procedure of this embodiment is:

(1) Compounds A, B and C with following formulae respectively are provided,

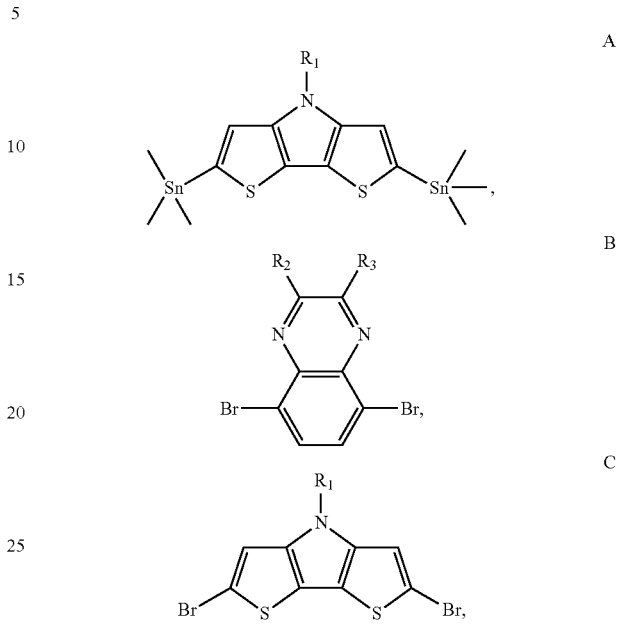

wherein, $R_1$ is $C_1$~$C_{20}$ alkyl, $R_2$ and $R_3$ are independently selected from the group consisting of —H, $C_1$~$C_{20}$ alkyl, $C_1$~$C_{20}$ alkoxyl, benzene ring group containing alkyl, fluorenyl group containing alkyl and carbazyl group containing alkyl;

(2) under oxygen-free environment and with the present of catalyst, organic solvent, Stille coupling of compounds A, B, C in a molar ratio of m:p:q is performed to give a conjugated polymer containing dithienopyrrole-quinoxaline represented by general structural formula (I), wherein, m=p+q, and m>q≥0,

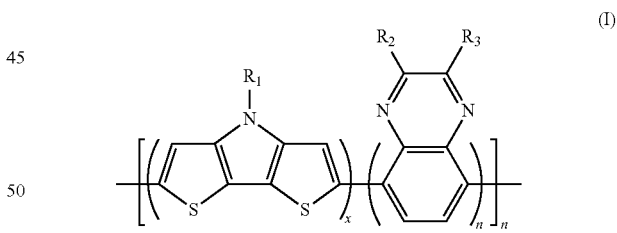

in the general formula (I), x+y=1, 0<y≤0.5, n is an integer and 1<n≤100.

The method for producing the compound B in the above step (1) preferably includes following steps:

At the temperature of 20~120□ and with the present of organic solvent, the dehydration reaction of compounds diketone and 3,6-dibromo-o-phenylene diamine in a molar ratio of 1:0.1~10 are carried out for 1~24 h to give the said compound B. Wherein the organic solvent in the dehydration reaction is preferably at least one selected from the group consisting of acetic acid, m-cresol, p-toluenesulfonic acid, chloroform, methanol, ethanol and butanol, and the amount thereof is at least that ensures the dehydration reaction proceed to completion.

In the Stille coupling reaction of the above step (2), when the addition amount of the compound C is 0, i.e. the q=0, only compounds A and B take part in this reaction, and the compounds A and B take part in the Stille coupling reaction in equimolar amounts, to give a conjugated polymer containing dithienopyrrole-quinoxaline of general formula (I), with the proviso that x+y=1, and x=y=0.5; when the addition amount of compound C is not 0, i.e. the q≠0, all of the compounds A, B and C take part in the Stille coupling reaction, to give a conjugated polymer containing dithienopyrrole-quinoxaline of general formula (I), with the proviso that x+y=1, and x≠y≠0.5.

Compound C (i.e. 2,6-dibromo-N-alkyl bisthiophene [3,2-b: 2',3'-d] pyrrole) is commercial available or can be produced by conventional method in this art, and compound A can be produced by conventional method in this art. The amount of the catalyst in this Stille coupling reaction is preferably 0.05%~50% molar percent of compound A; preferably, this catalyst is organic Pb catalyst or a blend of organic Pb catalyst and organic phosphine ligand, wherein the organic Pb catalyst is preferably at least one member selected from of the group consisting of $Pd_2(dba)_3$, $Pd(PPh_3)_4$, $Pd(PPh_3)_2Cl_2$, preferably, the organic phosphine ligand is preferably, but not limited to, $P(o\text{-}Tol)_3$; when the catalyst is a blend of organic Pb catalyst and organic phosphine ligand, the molar ratio of the organic Pb catalyst/organic phosphine ligand is 1:2~20.

The organic solvent in the abovementioned Stille coupling reaction is preferably one or more selected from the group consisting of tetrahydrofuran, ethylene glycol dimethyl ether, benzene, chlorobenzene, toluene, and the amount thereof is at least that ensures the Stille coupling reaction proceed to completion.

The reaction temperature of the abovementioned Stille coupling reaction is preferably 60~130° C., and the duration thereof is preferably 24~72 h.

A catalyst is necessary for the abovementioned Stille coupling reaction, as a result of that a middle product is yielded with a reagent in the Stille coupling reaction, thereby the Stille coupling reaction is carried out.

The above Stille coupling reaction should be carried out in an oxygen-free condition, as the reactants in the Stille coupling reaction and the oxygen are active, when the oxygen enters into the reaction circumstance, it will react with the reactants firstly, and the oxygen frustrates the formation of the intermediate product, as a result the Stifle coupling reaction fails. The oxygen-free circumstance may be achieved by evacuating or being filled with inert gas, and preferably by being filled with inert gas which is well known to one skilled in the art, e.g. nitrogen, argon and the like, and the nitrogen is preferred.

In the process of producing the conjugated polymer containing dithienopyrrole-quinoxaline, the reactants are added in a certain ratio, and no other special devices or special circumstance are needed, and the process is simple and has a high yield, the reaction condition is mild, easy to operate and control, and suitable for industrial production.

The abovementioned conjugated polymer containing dithienopyrrole-quinoxaline contains both N-alkyl bisthieno [3,2-b: 2',3'-d] pyrrole and quinoxaline structural units, thus the conjugated polymer may be applied in the field of organic photoelectricity material, polymer solar cell, organic electroluminescent devices, organic field effect transistors, organic optical storage, organic nonlinear material and/or organic laser.

The present invention will be explained in detail referring to Examples.

Example 1

Preparation of N-octyl bisthieno [3,2-b: 2',3'-d] pyrrole quinoxaline Conjugated Polymer, Represented by Formula $I_1$

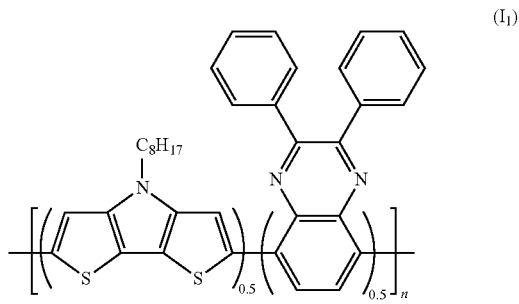

(I₁)

1) Preparation of 5,8-dibromo-2,3-bis(phenyl)quinoxaline, the Chemical Equation Thereof is

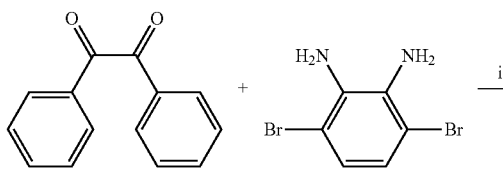

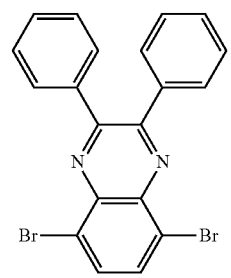

The detailed preparation procedure is as follows: 3,6-dibromo-o-phenylene diamine (1.0 g, 3.7 mmol) was added to a solution of compound benzil (0.39 g, 1.84 mmol) in acetic acid (20 mL) at 120□, then the mixture was mixed uniformly. After refluxed for 12 hours, the fluid reactant was poured into water, and neutralized with sodium bicarbonate until neutral, then extracted with chloroform and washed with saturated brine, dried over anhydrous sodium sulfate, then it was vacuum evaporated to remove the solvent, and the resulting crude product was purified by column chromatography to give a white solid, and then it was purified by recrystallization from chloroform/n-hexane to give a white solid powder. The test result is: MS (EI) m/z: 440(M+).

2) Preparation of 2,6-bis-trimethyl-tin-N-octyl bisthieno [3,2-b: 2',3'-d] pyrrole, the Chemical Equation Thereof is

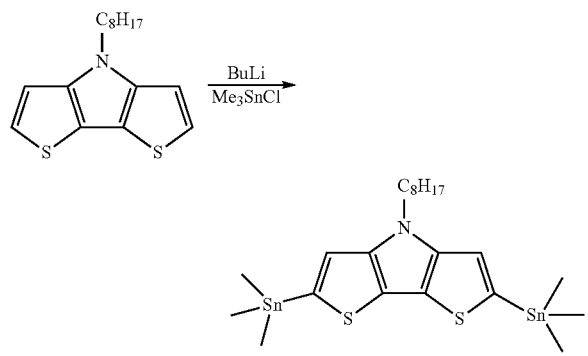

The detailed preparation procedure is: according to J. Am method (Chem. Soc. 2008, 130, 13167), t-BuLi (5.3 mL, 1.4 mol/L, 7.5 mmol) was added dropwise to a solution of N-octyl bisthieno [3,2-b: 2',3'-d] pyrrole (2.5 mmol, 0.727 g) in tetrahydrofuran (100 mL) at −78° C., then the mixture was slowly warmed up to room temperature, and stirred for 0.5 h, then cooled to −78° C. Trimethyltin chloride (7.5 mmol, 7.5 mL) was added dropwise to the above solution, and the solution was naturally warmed up to room temperature, stirred for 20 hours, then the reaction was quenched by water, followed by rotary evaporation to remove the tetrahydrofuran, then extracted with chloroform/water, washed with water, dried over anhydrous sodium sulfate, thus the organic phase was removed and a brown solid was obtained. MS (EI) m/z: 617 (M+).

3) Synthesis of N-octyl bisthieno [3,2-b:2',3'-d] pyrrole-quinoxaline Conjugated Polymer $I_1$, the Chemical Equation Thereof is as Follows

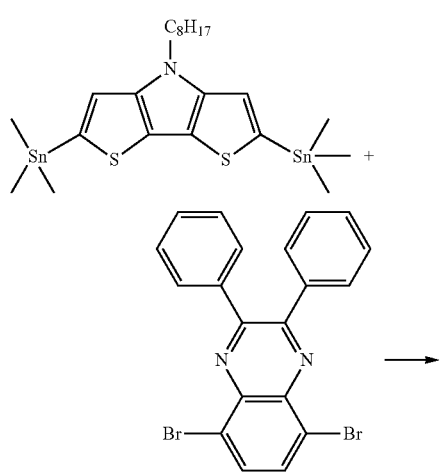

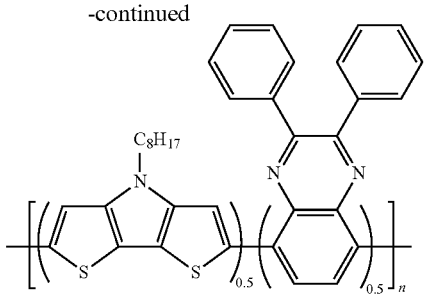

The detailed preparation procedure is: under the protection of nitrogen, a solution of compounds 5,8-dibromo-2,3-bis (phenyl)quinoxaline (0.22 g, 0.5 mmol) and 2,6-bis-trimethyltin-N-octyl bisthieno [3,2-b: 2',3'-d] pyrrole (0.31 g, 0.5 mmol) in chlorobenzene (15 mL) was bubbled with nitrogen for 0.5 h to remove the oxygen in the environment, then $Pd_2(dba)_3$ (0.014 g, 0.015 mol) and P(o-Tol)$_3$ (0.0083 g, 0.027 mmol) were added, and the solution was bubbled with nitrogen for another 1 h to remove residual oxygen and then heated to 60° C. under reflux for 72 hours. The resulting mixture was added dropwise to methanol to conduct a sedimentation, then the resulting product was vacuum filtrated, and washed with methanol and dried, then dissolved in chlorobenzene and the solution was added to aqueous sodium diethyldithiocarbamate solution and heated to 80° C. with stirring for 10 hours, then it was allowed to stand until the layers separated. The organic phase was passed through a column chromatography of alumina, eluted in chloroform. Then it was concentrated under reduced pressure to remove the organic solvent, followed by methanol sedimentation and vacuum filtration, and a solid was obtained. Then the solid was Soxhlet extracted with acetone for 72 hours, followed by methanol sedimentation and vacuum filtration, and the title product of this Example was obtained. The Molecular weight of the product (GPC, THF, R. I): Mn=29,500, Mw/Mn=1.7).

Example 2

Preparation of N-octyl bisthieno [3,2-b: 2',3'-d] pyrrole-quinoxaline Conjugated Polymer, Represented by Structural Formula $I_2$

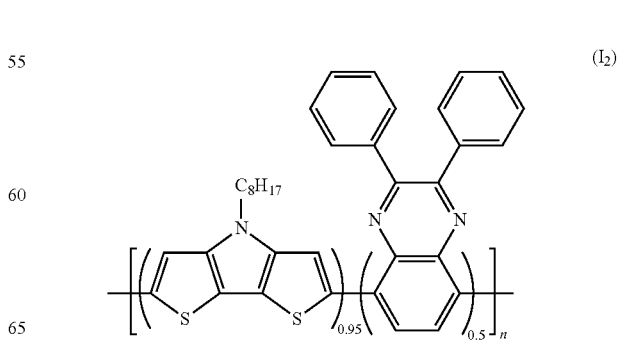

the steps 1) and 2) of this preparation are the same as those of Example 1;

3) Synthesis of N-octyl bisthieno [3,2-b: 2',3'-d] pyrrole-quinoxaline Conjugated Polymer of Formula I₂, the Chemical Equation Thereof is as Follows

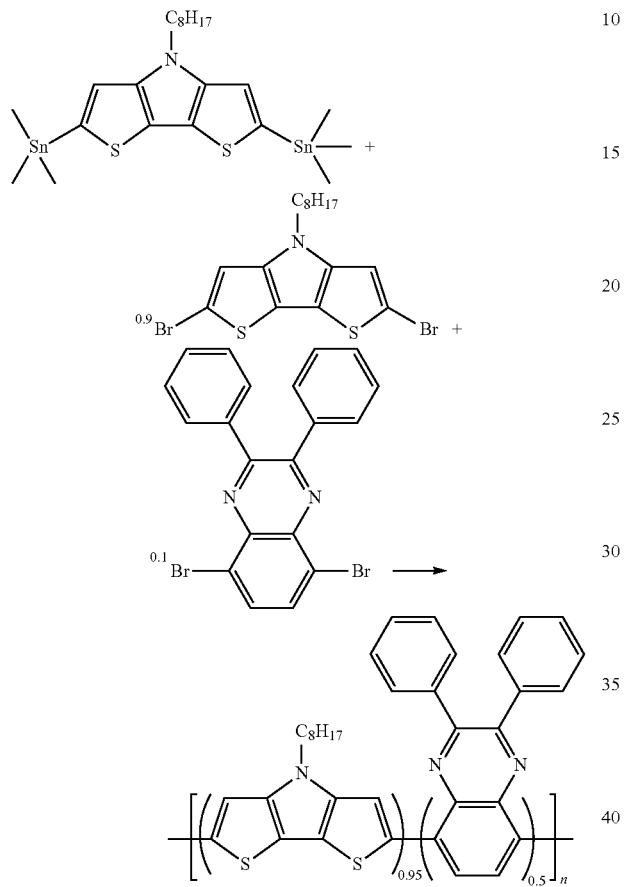

The detailed preparation procedure is: under the protection of argon, a solution of compounds 5,8-dibromo-2,3-bis(phenyl)quinoxaline (0.022 g, 0.05 mmol), 2,6-dibromo-N-octyl bisthieno [3,2-b: 2',3'-d] pyrrole (0.20 g, 0.45 mmol) and 2,6-bis-trimethyltin-N-octyl bisthieno [3,2-b: 2',3'-d] pyrrole (0.372 g, 0.5 mmol) in benzene (15 mL) was bubbled with nitrogen for 0.5 h to remove the oxygen in the reaction environment, then Pd(PPh₃)₄ (0.035 mmol) was added, and the solution was bubbled with nitrogen for another 1 h to remove residual oxygen and then heated to 130° C. under reflux for 24 hours. The resulting mixture was added dropwise to methanol to conduct a sedimentation, followed by vacuum filtration, the resulting product was washed with methanol, and dried, then dissolved in chlorobenzene and the resulting solution was added to aqueous sodium diethyldithiocarbamate solution, and the resulting mixture was heated to 80° C. with stirring for 15 hours, then it was allowed to stand until the layers separated. The organic phase was passed though a chromatography column of alumina, and eluted in chloroform, and concentrated under reduced pressure to remove the organic solvent, followed by methanol sedimentation, and vacuum filtration to afford a solid. The resulting solid was Soxhlet extracted with acetone for 72 hours, followed by methanol sedimentation, vacuum filtration, to give the title product of this Example. The Molecular weight of the product (GPC, THF, R. I): $M_n=43000$, $M_w/M_n=2.1$).

Example 3

Preparation of N-octyl bisthieno [3,2-b: 2',3'-d] pyrrole-quinoxaline Conjugated Polymer, the Structural Formula Thereof is Shown in Formula I₃

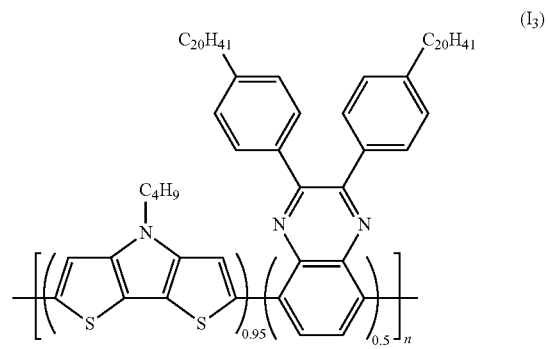

1) A compound of 5,8-dibromo-2-(4-n-eicosylphenyl)3-(4-n-eicosyloxy phenyl)quinoxaline of structural formula I₃' was prepared in the same procedure and under the similar conditions as step 1) in Example 1,

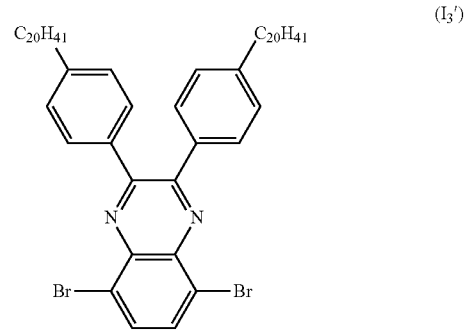

2) A compound of 2,6-bis-trimethyl-tin-N-butyl bisthieno [3,2-b: 2',3'-d] pyrrole of structural formula I₃" was prepared in the same procedure and under the similar condition as the step 2) in Example 1;

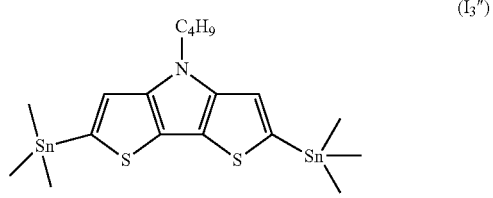

3) Synthesis of N-octyl bisthieno [3,2-b: 2',3'-d] pyrrole-quinoxaline conjugated polymer of formula I₃, the chemical equation thereof is as follows:

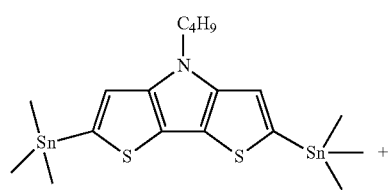

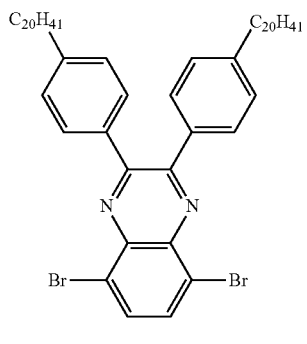

↓

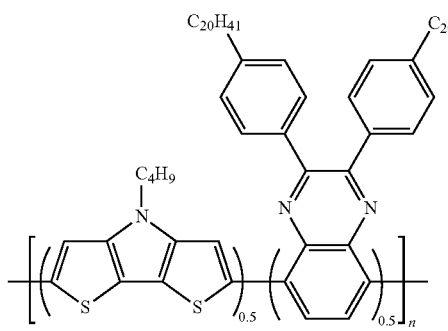

The detailed preparation procedure is: under the protection of nitrogen, a solution of compounds 5,8-dibromo-2-(4-n-eicosylphenyl)3-(4-n-eicosyloxyphenyl)quinoxaline (0.51 g, 0.5 mmol), 2,6-bis-trimethyltin-N-butylbisthieno[3,2-b: 2',3'-d]pyrrole (0.28 g, 0.5 mmol) in glycol dimethyl ether (15 mL) was bubbled with nitrogen for 0.5 h to remove the oxygen in the environment, then Pd$_2$(dba)$_3$ (0.014 g, 0.015 mol) and P(o-Tol)$_3$ (0.0083 g, 0.027 mmol) were added, and the solution was bubbled with nitrogen for another 1 h to remove residual oxygen and then heated to 100° C. under reflux for 72 hours. The resulting mixture was added dropwise to methanol to conduct a sedimentation, followed by vacuum filtration, then washed with methanol, and dried, then dissolved in chlorobenzene and the resulting solution was added to aqueous sodium diethyldithiocarbamate solution, and the mixture was heated to 80° C. with stirring for 8 hours, and the mixture was allowed to stand until the layers separated. The organic phase was passed through a chromatography column of alumina, then eluted in chloroform, and concentrated under reduced pressure to remove the organic solvent, followed by methanol sedimentation and vacuum filtration to afford a solid. The resulting solid was Soxhlet extracted with acetone for 72 hours, followed by methanol sedimentation, vacuum filtration, to give the title product. The Molecular weight of the title product (GPC, THF, R. I): $M_n$=89,500, $M_w/M_n$=2.1).

Example 4

Preparation of N-octyl bisthieno [3,2-b: 2',3'-d] pyrrole-quinoxaline Conjugated Polymer of Structure Formula I$_4$

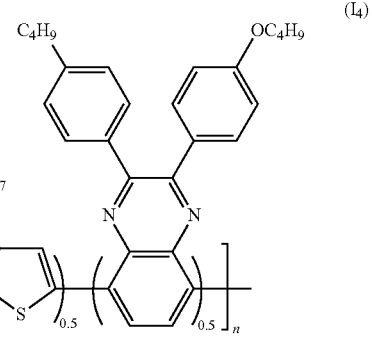

(I$_4$)

1) A compound of 5,8-dibromo-2-(4-n-butylphenyl)3-(4-n-butoxyphenyl)quinoxaline of following formula I$_4$' is prepared in the same procedure and under the similar conditions as step 1) in Example 1,

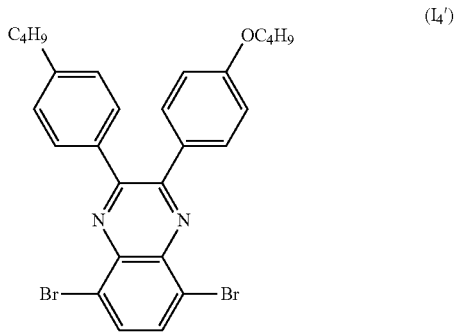

(I$_4$')

2) A compound of 2,6-bis-trimethyl-tin-N-octyl bisthieno [3,2-b: 2',3'-d] pyrrole was prepared in the same procedure as step 2) in Example 1;

3) Synthesis of N-octyl bisthieno [3,2-b: 2',3'-d] pyrrole-quinoxaline conjugated polymer of formula I$_4$, the chemical equation thereof is as follows:

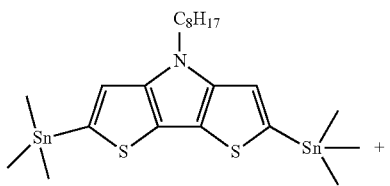

-continued

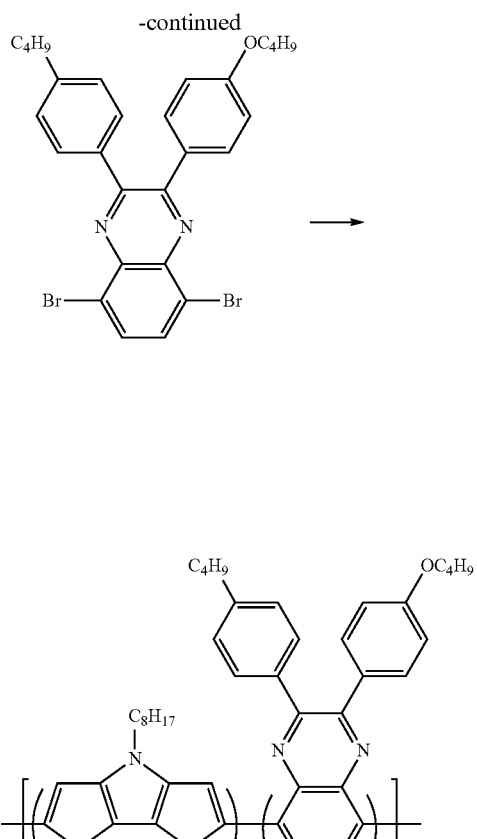

The detailed preparation procedure is: under the protection of nitrogen, a solution of compounds 5,8-dibromo-2-(4-n-butylphenyl)3-(4-n-butoxyphenyl)quinoxaline (0.28 g, 0.5 mmol), 2,6-bis-trimethyltin-N-octylbisthieno [3,2-b: 2',3'-d] pyrrole (0.31 g, 0.5 mmol) in tetrahydrofuran (15 mL) was bubbled with nitrogen for 0.5 h to remove the oxygen in the environment, then Pd(PPh$_3$)$_2$Cl$_2$ (0.030 mmol) was added, and the solution was bubbled with nitrogen for another 1 h to remove residual oxygen and then heated to 100° C. under reflux for 24 hours. The resulting mixture was added dropwise to methanol to conduct a sedimentation, followed by vacuum filtration, then washed with methanol and dried, then dissolved in chlorobenzene and the resulting solution was added to aqueous sodium diethyldithiocarbamate solution, and then the mixture was heated to 80° C. with stirring for 6 hours, and the mixture was allowed to stand until the layers separated. The resulting organic phase was passed through a chromatography column of alumina, then eluted in chloroform, and concentrated under reduced pressure to remove the organic solvent, followed by methanol sedimentation and vacuum filtration to afford a solid. The resulting solid was Soxhlet extracted with acetone for 72 hours, followed by methanol sedimentation and vacuum filtration to give the title product. The Molecular weight of the product (GPC, THF, R. I): $M_n$=68,500, $M_w/M_n$=1.7).

Example 5

Preparation of N-octyl bisthieno [3,2-b: 2',3'-d] pyrrole-quinoxaline Conjugated Polymer of Following Formula I$_5$

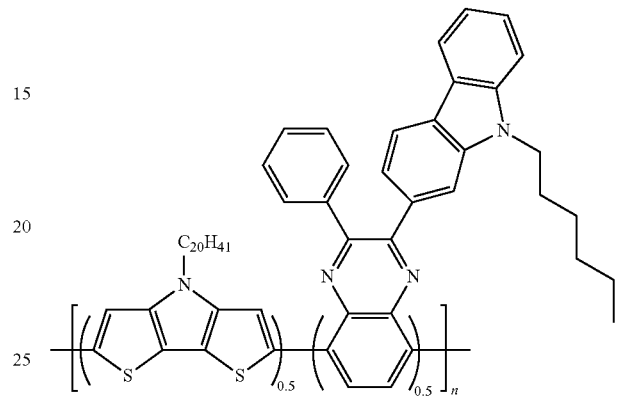

(I$_5$)

1) Preparation of 5,8-dibromo-2(3-(N-alkylcarbazol)yl)-3-phenyl-quinoxaline, the chemical equation thereof is:

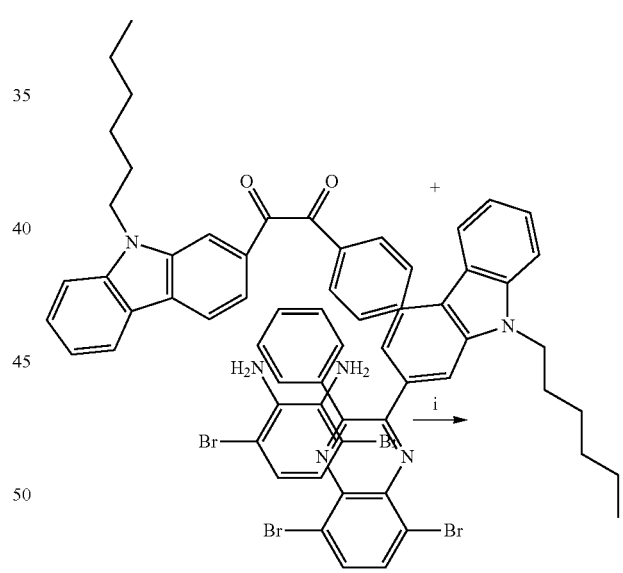

The detailed preparation procedure is: 3,6-dibromo-o-phenylene diamine (1.0 g, 3.7 mmol) was added to a solution of compound 2-(3-(N-hexylcarbazole)yl)phenylethanedione (0.68 g, 1.78 mmol) in butanol (20 mL) at 20□, then mixed uniformly, and the mixture was refluxed for 24 hours. The resulting fluid reactant was poured into water, and neutralized with sodium bicarbonate until neutral, then extracted with chloroform and washed with saturated brine, dried over anhydrous sodium sulfate, and the solvent was removed by rotary evaporation to afford a crude product. The crude product was purified by column chromatography to give a white solid, and then it was purified by recrystallization in chloroform/n-hexane to give a white powder. MS (MALDI) m/z: 614 (M$^+$).

2) A compound of 2,6-bis-trimethyl-tin-N-n-eicosyl bisthieno [3,2-b: 2',3'-d] pyrrole with the structural formula I₅" was prepared in the same procedure and under the similar condition as step 2) of Example 1;

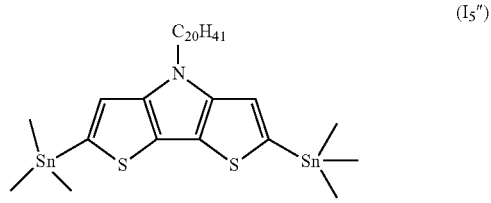

(I₅")

3) Synthesis of N-octyl bisthieno [3,2-b: 2',3'-d] pyrrole-quinoxaline conjugated polymer of formula. I₅, the chemical equation thereof is as follows:

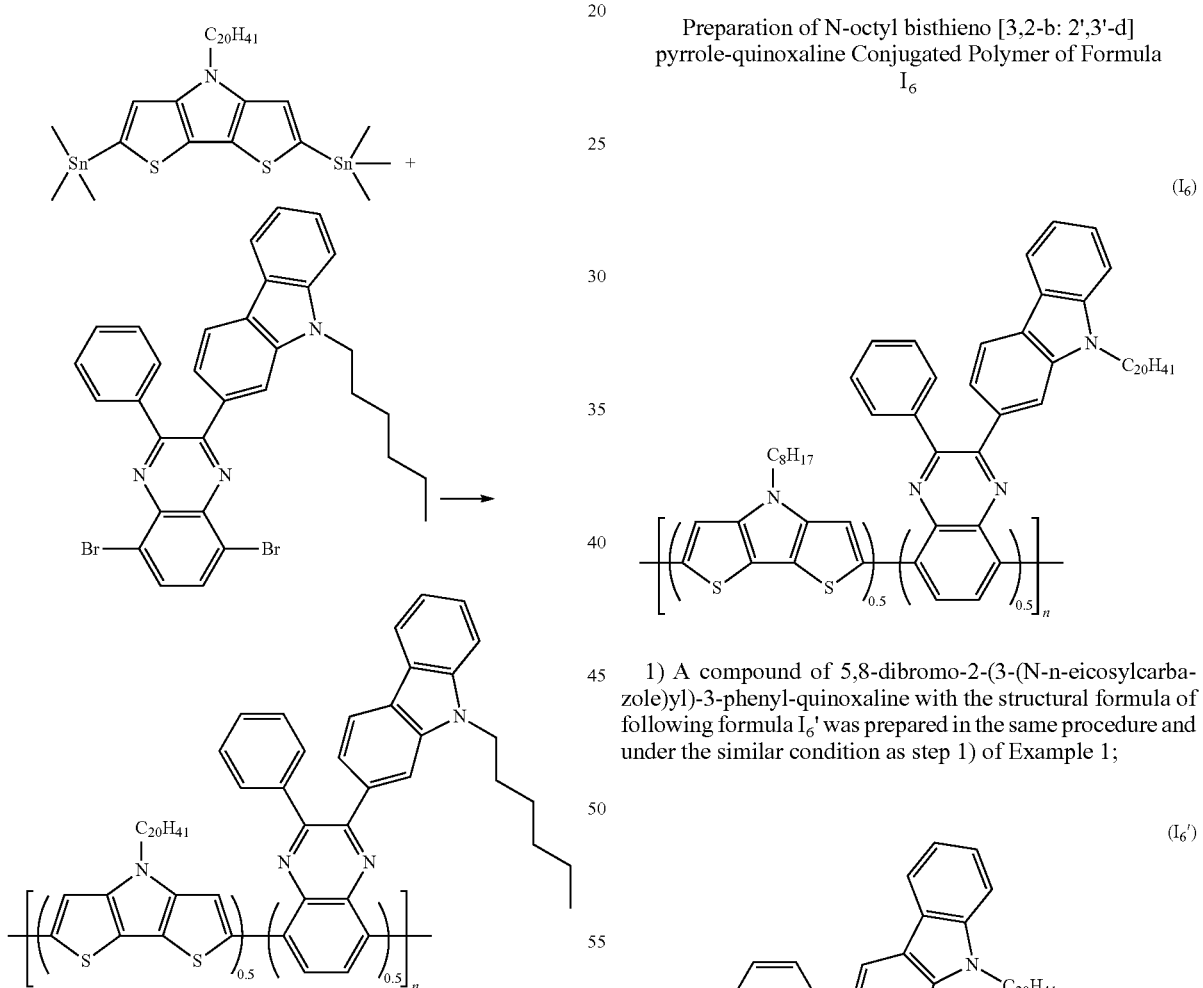

The detailed preparation procedure is: under the condition of vacuum, a solution of compounds 5,8-dibromo-2-(3-(N-hexylcarbazole)yl-3-phenyl-quinoxaline (0.31 g, 0.5 mmol) and 2,6-bis-trimethyltin-N-n-eicosyl bisthieno [3,2-b: 2',3'-d] pyrrole (0.39 g, 0.5 mmol) in a mixture (15 mL) of tetrahydrofuran and chlorobenzene with the volume ratio of 1:1 was bubbled with nitrogen for 0.5 h to remove the oxygen in the environment, then Pd₂(dba)₃ (0.014 g, 0.015 mol) and P(o-Tol)₃ (0.0083 g, 0.027 mmol) were added, and the solution was bubbled with nitrogen for another 1 h to remove residual oxygen and then heated to 100° C. under reflux for 72 hours. The resulting mixture was added dropwise to methanol to conduct a sedimentation, and vacuum filtrated, washed with methanol and dried, then dissolved in chlorobenzene and the resulting solution was added to aqueous sodium diethyldithiocarbamate solution, and the mixture was heated to 80° C. with stirring for 20 hours, the mixture was allowed to stand and until the layers separated, the resulting organic phase was passed through a column chromatography of alumina, eluted in chloroform, and concentrated under reduced pressure to remove the organic solvent, followed by methanol sedimentation and vacuum filtrated to afford a solid. The resulting solid was Soxhlet extracted with acetone for 72 hours, followed by methanol sedimentation and vacuum filtration to give a product. The Molecular weight of the product (GPC, THF, R. I): $M_n=39000$, $M_w/M_n=1.7$).

Example 6

Preparation of N-octyl bisthieno [3,2-b: 2',3'-d] pyrrole-quinoxaline Conjugated Polymer of Formula I₆

(I₆)

1) A compound of 5,8-dibromo-2-(3-(N-n-eicosylcarbazole)yl)-3-phenyl-quinoxaline with the structural formula of following formula I₆' was prepared in the same procedure and under the similar condition as step 1) of Example 1;

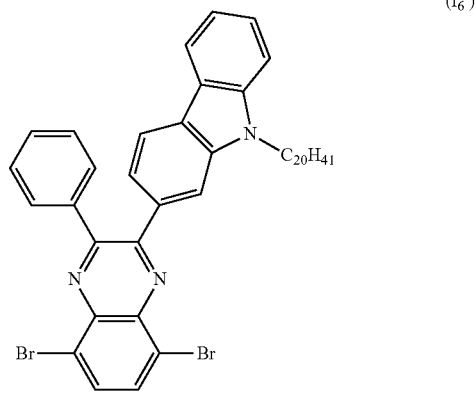

(I₆')

2) A compound of 2,6-bis-trimethyltin-N-octyl bisthieno [3,2-b: 2',3'-d] pyrrole was prepared in the same procedure as step 2) in Example 1;

3) Synthesis of N-octyl bisthieno [3,2-b: 2',3'-d] pyrrole-quinoxaline conjugated polymer of formula $I_6$, the chemical equation thereof is as follows:

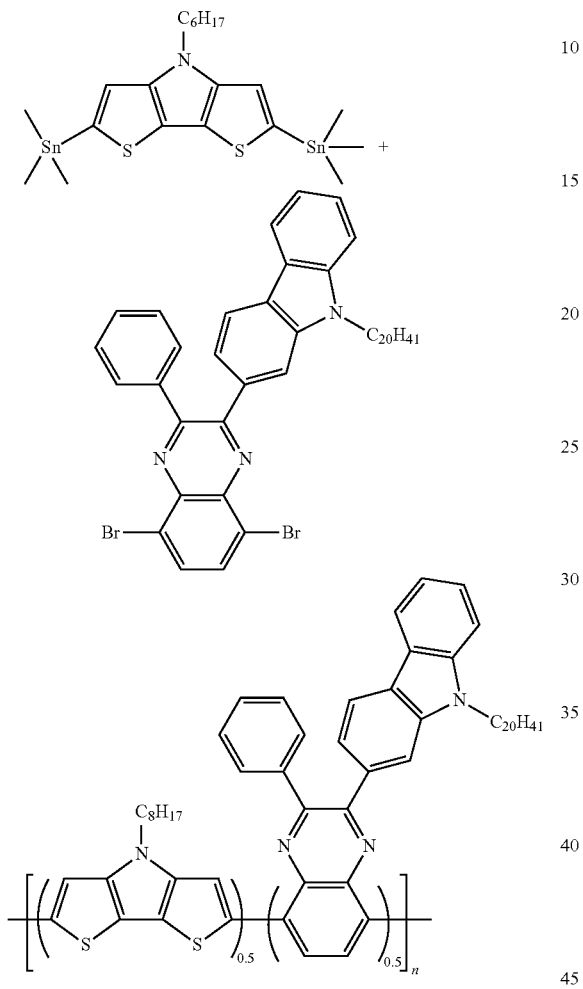

The detailed preparation procedure is: under the protection of nitrogen, a solution of compounds 5,8-dibromo-2-(3-(N-n-eicosylcarbazole)yl)-3-phenyl-quinoxaline (0.41 g, 0.5 mmol) and 2,6-bis-trimethyltin-N-octyl bisthieno [3,2-b: 2',3'-d] pyrrole (0.31 g, 0.5 mmol) in chlorobenzene (15 mL) was bubbled with nitrogen for 0.5 h to remove the oxygen in the reaction environment, then $Pd(PPh_3)_4$ (0.015 mol) and $Pd(PPh_3)_2Cl_2$ (0.027 mmol) were added, and the solution was bubbled with nitrogen for another 1 h to remove residual oxygen and then heated to 100□ under reflux for 72 hours. The resulting mixture was added dropwise to methanol to conduct a sedimentation, then the resulting product was vacuum filtrated, and washed with methanol and dried, then dissolved in chlorobenzene. The resulting solution was added to aqueous sodium diethyldithiocarbamate solution and heated to 80° C. with stirring for 6 hours, then it was allowed to stand until the layers separated. The resulting organic phase was passed through a column chromatography of alumina, eluted in chloroform, and concentrated under reduced pressure to remove the organic solvent, followed by methanol sedimentation and vacuum filtration to afford a solid. The resulting solid was Soxhlet extracted with acetone for 72 hours, followed by methanol sedimentation and vacuum filtration to give the title product of this Example. The Molecular weight of the product (GPC, THF, R. I): $M_n$=41000, $M_w/M_n$=2.3).

Example 7

Preparation of N-octyl bisthieno [3,2-b: 2',3'-d] pyrrole-quinoxaline Conjugated Polymer of Following Formula $I_7$

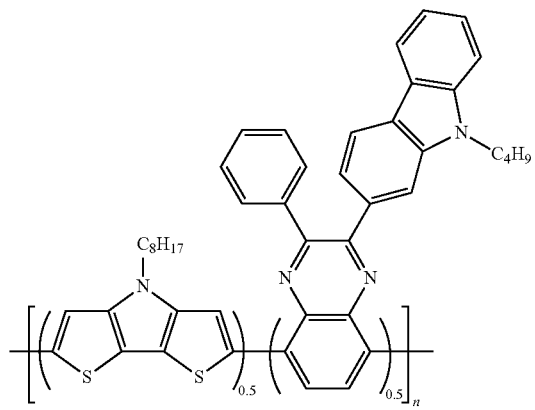

1) A compound of 5,8-dibromo-2-(3-(N-n-eicosylcarbazole)yl)-3-phenyl-quinoxaline with the structural formula of following formula $I_7'$ was prepared in the same procedure and under the similar condition as step 1) of Example 1;

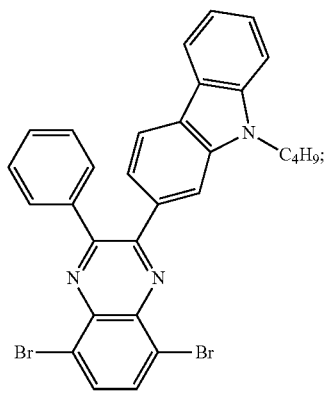

2) A compound of 2,6-bis-trimethyltin-N-octyl bisthieno [3,2-b: 2',3'-d] pyrrole was prepared in the same procedure as step 2) in Example 1;

3) Synthesis of N-octyl bisthieno [3,2-b: 2',3'-d] pyrrole-quinoxaline conjugated polymer of formula $I_7$, the chemical equation thereof is as follows:

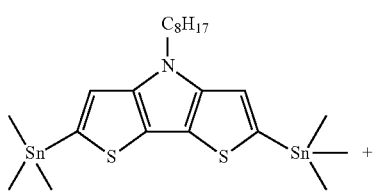

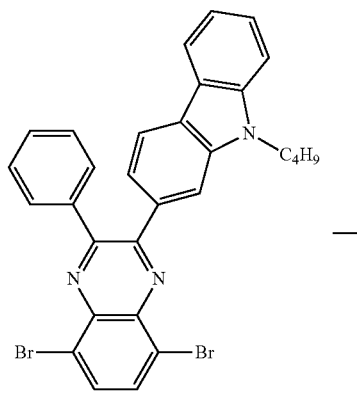

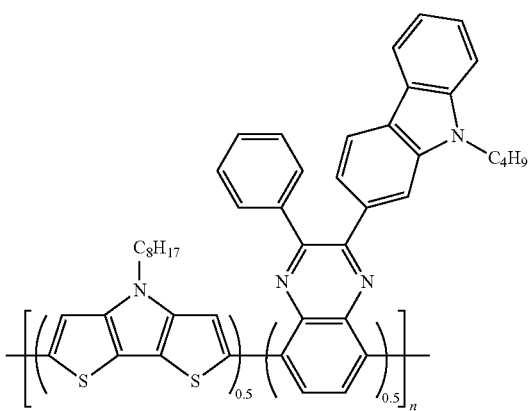

The detailed preparation procedure is: under the protection of nitrogen, a solution of compounds 5,8-dibromo-2-(3-(N-n-butyl carbazole)yl)-3-phenyl-quinoxaline (0.29 g, 0.5 mmol) and 2,6-bis-trimethyltin-N-octyl bisthieno [3,2-b: 2',3'-d] pyrrole (0.31 g, 0.5 mmol) in chlorobenzene (15 mL) was bubbled with nitrogen for 0.5 h to remove the oxygen in the reaction environment, then Pd$_2$(dba)$_3$ (0.014 g, 0.015 mol) and P(o-Tol)$_3$ (0.0083 g, 0.027 mmol) were added, and the solution was bubbled with nitrogen for another 1 h to remove residual oxygen and then heated to 100□ under reflux for 28 hours. The resulting mixture was added dropwise to methanol to conduct a sedimentation, then the resulting product was vacuum filtrated, and washed with methanol and dried, then dissolved in chlorobenzene. The resulting solution was added to aqueous sodium diethyldithiocarbamate solution and heated to 80° C. with stirring for 20 hours, then it was allowed to stand until the layers separated. The organic phase was passed through a column chromatography of alumina, then eluted in chloroform, and concentrated under reduced pressure to remove the organic solvent, followed by methanol sedimentation and vacuum filtration to afford a solid. The resulting solid was Soxhlet extracted with acetone for 72 hours, then sedimentated with methanol and vacuum filtrated to give the title product. The Molecular weight of the product (GPC, THF, R. I): $M_n$=29000, $M_w/M_n$=1.7).

Example 8

Preparation of N-octyl bisthieno [3,2-b: 2',3'-d] pyrrole-quinoxaline Conjugated Polymer of Following Formula I$_8$

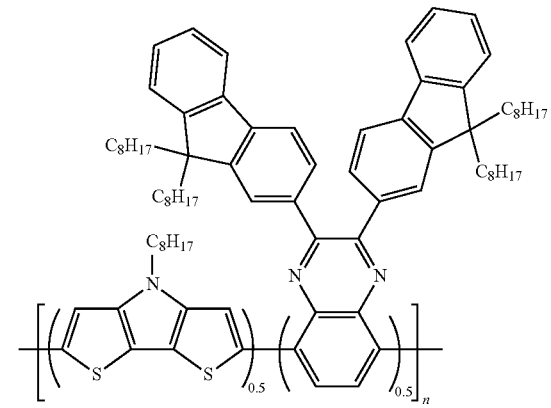

(I$_8$)

1) Preparation of 5,8-dibromo-2,3-bis((2-(9,9-di-octylfluorene)yl)-quinoxaline, the chemical equation thereof is as follows:

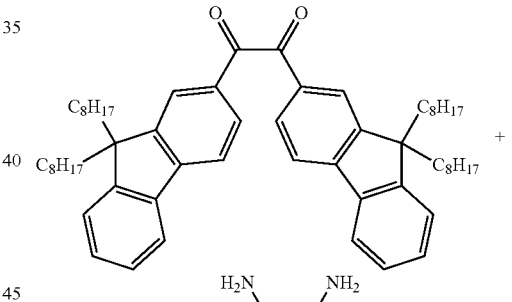

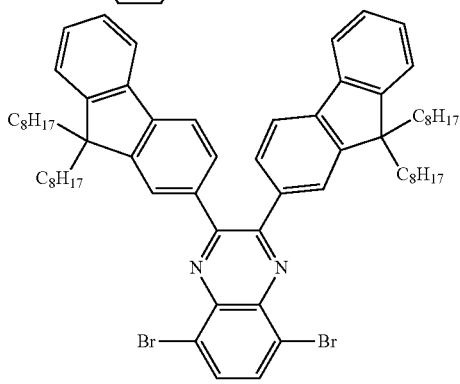

The detailed preparation procedure is: 3,6-dibromo-o-phenylene diamine (0.5 g, 1.85 mmol) was added to a solution of compound di-(9,9-di-octylfluorene)yl ethaneditone (0.42 g, 5.0 mmol) in a mixture (20 mL) of acetic acid and m-cresol with the volume ratio of 1:2 at 80□, following mixed uniformly the mixture was refluxed for 18 hours. The resulting fluid reactant was poured into water, and neutralized with sodium bicarbonate until neutral, then extracted with chloroform and washed with saturated brine, dried over anhydrous sodium sulfate, and the solvent was removed by rotary evaporation to afford a crude product. The crude product was purified by column chromatography to afford a white solid, and then it was purified by recrystallization in chloroform/n-hexane to give a solid powder. MS (MALDI) m/z: 1065.2 (M$^+$).

2) A compound of 2,6-bis-trimethyltin-N-octyl bisthieno [3,2-b: 2',3'-d] pyrrole was prepared in the same procedure as step 2) in Example 1;

3) Synthesis of N-octyl bisthieno [3,2-b: 2',3'-d] pyrrole-quinoxaline conjugated polymer of following formula $I_8$, the chemical equation thereof is as follows:

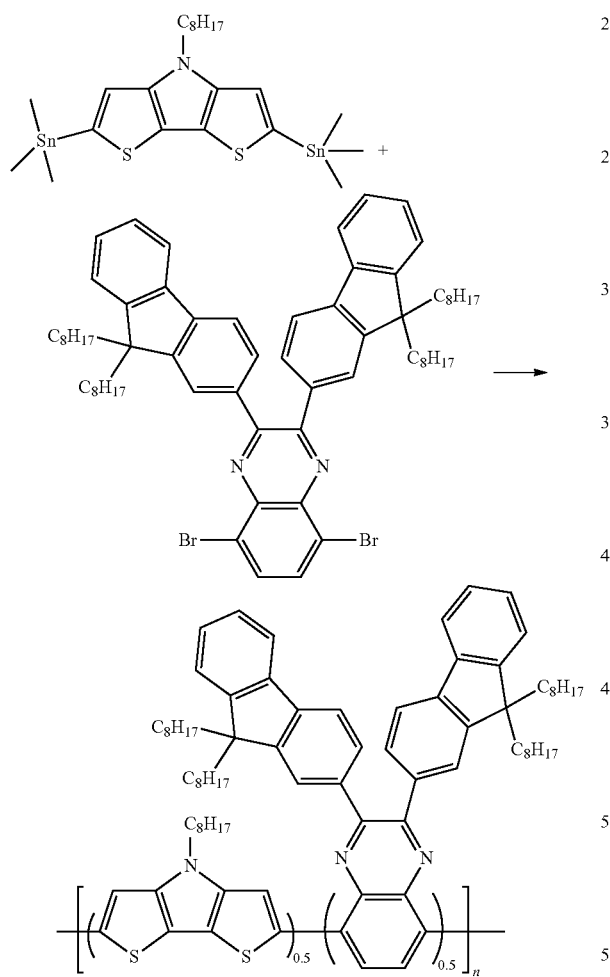

The detailed preparation procedure is: under the protection of nitrogen, a solution of compounds 5,8-dibromo-2,3-bis((2-(9,9-di-octyl fluorene)yl-quinoxaline (0.53 g, 0.5 mmol) and 2,6-bis-trimethyltin-N-octyl bisthieno [3,2-b: 2',3'-d] pyrrole (0.31 g, 0.5 mmol) in toluene (30 mL) was bubbled with nitrogen for 0.5 h to remove the oxygen in the reaction environment, then Pd$_2$(dba)$_3$ (0.014 g, 0.015 mol) and P(o-Tol)$_3$ (0.0083 g, 0.027 mmol) were added, and the solution was bubbled with nitrogen for another 1 h to remove residual oxygen and then heated to 100□ under reflux for 72 hours.

The resulting mixture was added dropwise to methanol to conduct a sedimentation, then vacuum filtrated, and washed with methanol and dried, then dissolved in chlorobenzene. The resulting solution was added to aqueous sodium diethyldithiocarbamate solution and heated to 80° C. with stirring for 12 hours, then it was allowed to stand until the layers separated. The resulting organic phase was passed through a column chromatography of alumina, then eluted in chloroform, and concentrated under reduced pressure to remove the organic solvent, followed by methanol sedimentation and vacuum filtration to afford a solid. The resulting solid was Soxhlet extracted with acetone for 72 hours, followed by methanol sedimentation and vacuum filtration, to obtain the title product. The Molecular weight of the product (GPC, THF, R. I): $M_n$=93500, $M_w/M_n$=2.5).

Example 9

Preparation of N-octyl bisthieno [3,2-b:2',3'-d] pyrrole-quinoxaline Conjugated Polymer of Following Formula $I_9$

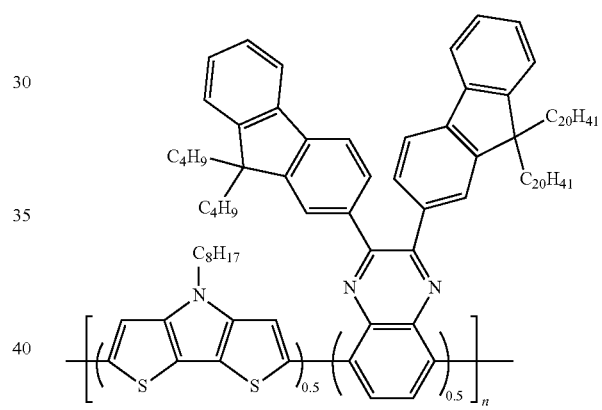

1) A compound of 5,8-dibromo 2-(2-(9,9-di-octylfluorene) yl)-3-((2-(9,9-di-n-eicosylfluorene)yl)-quinoxaline of following formula $I_9'$ was prepared in the same procedure and under the similar condition as step 1) of Example 1;

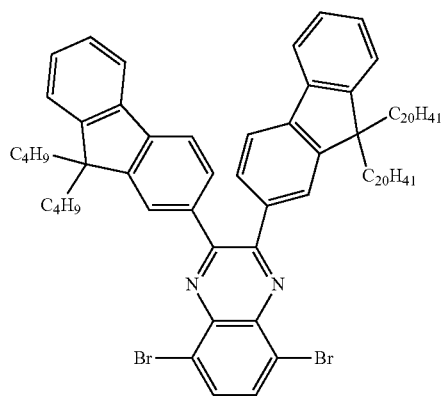

2) A compound of 2,6-bis-trimethyltin-N-octyl bisthieno [3,2-b: 2',3'-d] pyrrole was prepared in the same procedure as step 2) in Example 1;

3) Synthesis of N-octyl bisthieno [3,2-b: 2',3'-d] pyrrole-quinoxaline conjugated polymer of formula $I_9$, the chemical equation thereof is as follows:

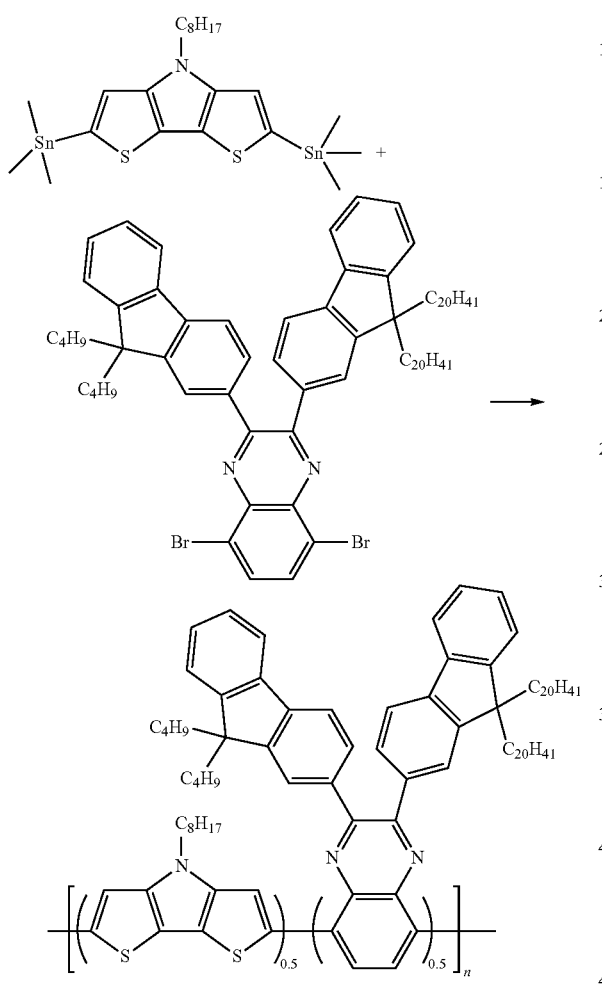

The detailed preparation procedure is: under the protection of nitrogen, a solution of compounds 5,8-dibromo 2-(2-(9,9-di-octyl fluorene)yl)-3-((2-(9,9-di-n-eicosylfluorene)yl)-quinoxaline (0.64 g, 0.5 mmol) and 2,6-bis-trimethyltin-N-octyl Bisthieno [3,2-b: 2',3'-d] pyrrole (0.31 g, 0.5 mmol) in toluene (30 mL) was bubbled with nitrogen for 0.5 h to remove the oxygen in the reaction environment, then $Pd_2(dba)_3$ (0.014 g, 0.015 mol) and P(o-Tol)$_3$ (0.0083 g, 0.027 mmol) were added, and the solution was bubbled with nitrogen for another 1 h to remove residual oxygen and then heated to 100□ under reflux for 72 hours. The resulting mixture was added dropwise to methanol to conduct a sedimentation, followed by vacuum filtration, and it was washed with methanol and dried, then dissolved in chlorobenzene. The resulting solution was added to aqueous sodium diethyldithiocarbamate solution and heated to 80° C. with stirring for 10 hours, then it was allowed to stand until the layers separated. The organic phase was passed through a column chromatography of alumina, and eluted in chloroform, and concentrated under reduced pressure to remove the organic solvent, following methanol sedimentation and vacuum filtration, a solid was obtained. The resulting solid was Soxhlet extracted with acetone for 72 hours, followed by methanol sedimentation and vacuum filtration to give the title product. The Molecular weight of the product (GPC, THF, R. I): $M_n$=105,000, $M_w/M_n$=2.7).

Example 10

Preparation of N-octyl bisthieno [3,2-b: 2',3'-d] pyrrole-quinoxaline Conjugated Polymer of Following Formula $I_{10}$

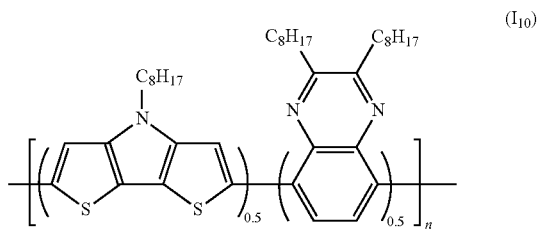

(I$_{10}$)

1) Preparation of 5,8-dibromo-2,3-di-octyl-quinoxaline, the chemical equation thereof is:

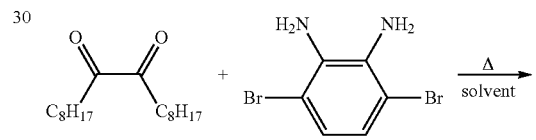

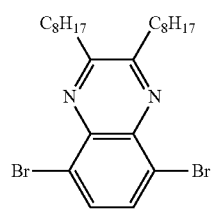

The detailed preparation procedure is: 3,6-dibromo-o-phenylene diamine (0.5 g, 1.85 mmol) was added to a solution of compound di-octyl ethanedione (0.28 g, 1 mmol) in acetic acid (30 mL) at 120□, the mixture was mixed uniformly and refluxed for 18 hours. The resulting fluid reactant was poured into water, and neutralized with sodium bicarbonate until neutral, then extracted with chloroform and washed with saturated brine, dried over anhydrous sodium sulfate, and the solvent was removed by rotary evaporation to give a crude product. The crude product was purified by column chromatography to give a white solid, then it was purified by recrystallization in chloroform/n-hexane to give the title product of this step. MS (EI) m/z: 512 (M$^+$).

2) A compound of 2,6-bis-trimethyl-tin-N-octyl bisthieno [3,2-b: 2',3'-d] pyrrole was prepared in the same procedure as step 2) of Example 1;

3) Synthesis of N-octyl bisthieno [3,2-b: 2',3'-d] pyrrole-quinoxaline conjugated polymer of formula I₁₀, the chemical equation thereof is as follows:

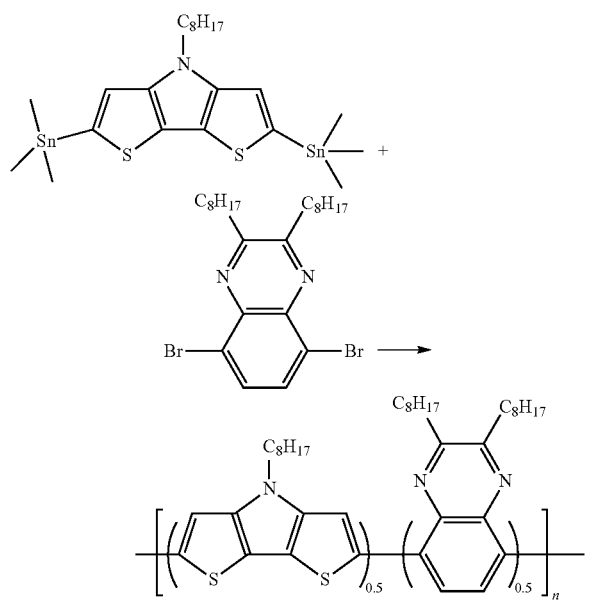

The detailed preparation procedure is: under the protection of nitrogen, a solution of compounds 5,8-dibromo-2,3-dioctyl-quinoxaline (0.26 g, 0.5 mmol) and 2,6-bis-trimethyltin-N-octylbisthieno[3,2-b: 2',3'-d]pyrrole (0.31 g, 0.5 mmol) in toluenen (30 mL) was bubbled with nitrogen for 0.5 h to remove the oxygen in the environment, then $Pd_2(dba)_3$ (0. 0.14 g, 0.015 mol) and $P(o\text{-}Tol)_3$ (0.0083 g, 0.027 mmol) were added, and the solution was bubbled with nitrogen for another 1 h to remove residual oxygen and then heated to 100° C. under reflux for 72 hours. The resulting mixture was added dropwise to methanol was to conduct a sedimentation, then vacuum filtrated, washed with methanol and dried, and dissolved in chlorobenzene. The resulting solution was added to aqueous sodium diethyldithiocarbamate solution, and the mixture was heated to 80° C. with stirring for 12 hours, then the mixture was allowed to stand until the layers separated. The resulting organic phase was passed through a column chromatography of alumina, then eluted in chloroform, and concentrated under reduced pressure to remove the organic solvent, following methanol sedimentation and vacuum filtration, the title product was obtained. The Molecular weight of the product (GPC, THF, R. I): $M_n=75500$, $M_w/M_n=1.9$).

Example 11

Preparation of N-octyl bisthieno [3,2-b: 2',3'-d] pyrrole-quinoxaline Conjugated Polymer of Following Formula $I_{11}$

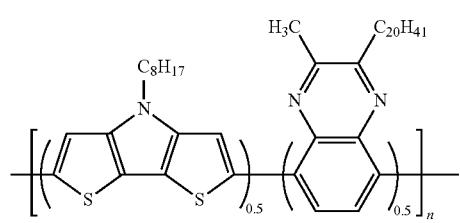

(I₁₁)

1) A compound of 5,8-dibromo 2-methyl-3-n-eicosyl-quinoxaline with the structural formula of following formula $I_{11}'$ was prepared in the same procedure and under the similar condition as step 1) of Example 10;

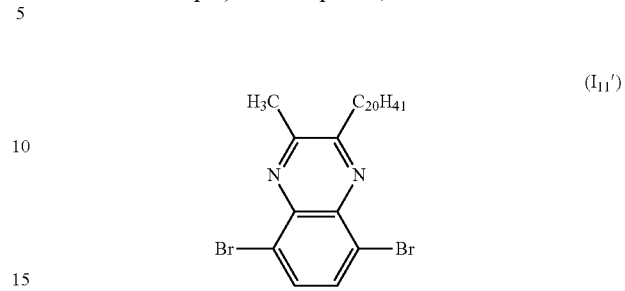

(I₁₁')

2) A compound of 2,6-bis-trimethyltin-N-octyl bisthieno [3,2-b: 2',3'-d] pyrrole was prepared in the same procedure as step 2) in Example 1;

3) Synthesis of N-octyl bisthieno [3,2-b: 2',3'-d] pyrrole-quinoxaline conjugated polymer of formula $I_{11}$, the chemical equation thereof is as follows:

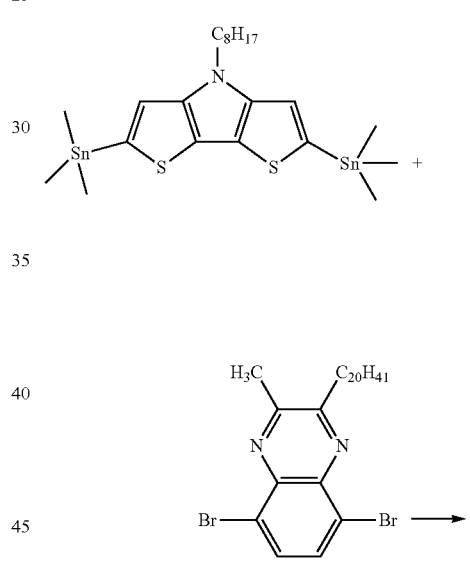

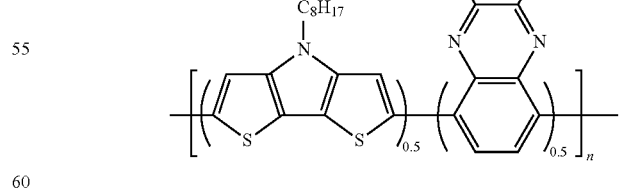

The detailed preparation procedure is: under the protection of nitrogen, a solution of compounds 5,8-dibromo 2-methyl-3-n-eicosyl-quinoxaline (0.29 g, 0.5 mmol), 2,6-bis-trimethyltin-N-octyl bisthieno [3,2-b: 2',3'-d] pyrrole (0.31 g, 0.5 mmol) in toluene (30 mL) was bubbled with nitrogen for 0.5 h to remove the oxygen in the reaction environment, then Pd$_2$(dba)$_3$ (0.014 g, 0.015 mol) and P(o-Tol)$_3$ (0.0083 g, 0.027 mmol) were added, and the solution was bubbled with nitrogen for another 1 h to remove residual oxygen and then heated to 100□ under reflux for 72 hours. The resulting mixture was added dropwise to methanol to conduct a sedimentation, then it was vacuum filtrated, and washed with methanol and dried, then dissolved in chlorobenzene. The resulting solution was added to aqueous sodium diethyldithiocarbamate solution and heated to 80° C. with stirring for 12 hours, then it was allowed to stand until the layers separated. The organic phase was passed through a column chromatography of alumina. The organic phase was passed through a column chromatography of alumina, then eluted in chloroform, and concentrated under reduced pressure to remove the organic solvent, followed by methanol sedimentation and vacuum filtration, and a solid was obtained. The resulting solid was Soxhlet extracted with acetone for 72 hours, followed by methanol sedimentation and vacuum filtration, and the title product was obtained. The Molecular weight of the product (GPC, THF, R. I): $M_n$=43800, $M_w/M_n$=2.1).

Application Example 12

Figure 2:
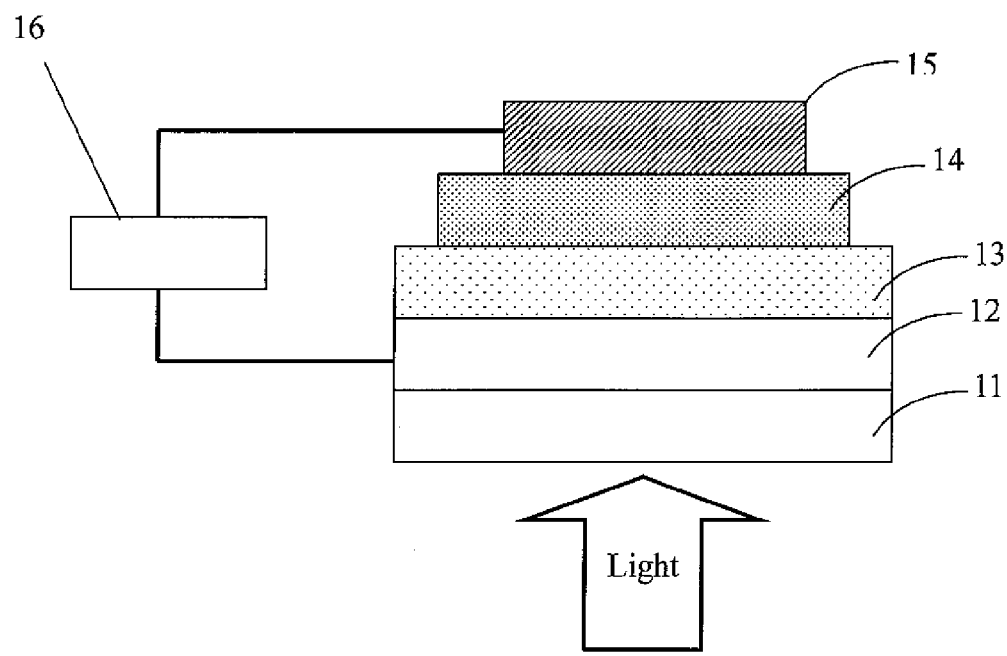
FIG. 2 is a structural schematic view of a polymer solar cell device comprising the conjugated polymer containing dithienopyrrole-quinoxaline prepared in Example 1 as an active layer.

Preparation of solar cell device containing the polymer made in Example 1 as an active layer:

Referring to FIG. 2, the solar cell device comprises a glass substrate 11, a transparent anode 12, a middle auxiliary layer 13, an active layer 14, a cathode 15 in a stacked structure, wherein the middle auxiliary layer 13 is made from poly(3,4-ethylenedioxythiophene): polystyrene-sulfonic acid composite (abbreviated as PEDOT:PSS), the active layer 14 includes an electron donor material and an electron acceptor material, and the electron donor material is made from the polymer made in Example 1, the electron acceptor material may be [6,6]phenyl-$C_{61}$-butyric acid methyl ester (abbreviated as PCBM). The transparent anode 12 may be made from Indium Tin Oxide (abbreviated as ITO), preferably from the Indium Tin Oxide with the sheet resistance of 10-20Ω/□. The cathode 15 may be an aluminum electrode or a double-metal-layer electrode, for example, Ca/Al, or Ba/Al and the like. The glass substrate 11 may be used as the bottom layer. In manufacturing, an ITO glass is selected, then it is ultrasonic washed, and treated with Oxygen-Plasma, then the middle auxiliary layer 13 is coated on the ITO glass, and the polymer made in Example 1 and the electron acceptor material are blended before coated on the middle auxiliary layer 13, thus formed the active layer 14 thereon, then the cathode 15 is deposited on the active layer 14 by vacuum evaporation, to obtain the solar cell device. In a preferred embodiment, the thicknesses of the transparent anode 12, middle auxiliary layer 13, active layer 14, double-metal-layer Ca—Al layer are 170, 40, 150, 70 nm respectively.

Referring to FIG. 2, under illumination, the light passes through the glass substrate 11 and the ITO electrode 12, and the polymer made in Example 1 in the active layer 14 absorbs light energy and generates exactions, then these exactions migrate to the interface between the electron donor/acceptor materials, and the electron is transferred to the electron acceptor material, such as PCBM, so as to achieve the separation of the charge, and produce free carriers, i.e. free electrons and holes. These free electrons are transferred along the electron acceptor material towards the metal cathode and collected by the cathode, meanwhile the free holes are transferred along the electron donor material towards the ITO anode and collected by the anode, to give photocurrent and photovoltage, and the photoelectric conversion is achieved. When there is an external load 16 connected to the device, the device will supply power to the external load. In this process, the polymer prepared in Example 1 may utilize the light energy more sufficiently due to its very wide spectral response range, and have higher photoelectric conversion efficiency, thus the power production capacity of the solar cell device is increased. Furthermore this organic material may reduce the weight of the solar cell device containing the same, and can be produced by spin coating technology, and may be prepared in large scale.

Application Example 13

Figure 3:
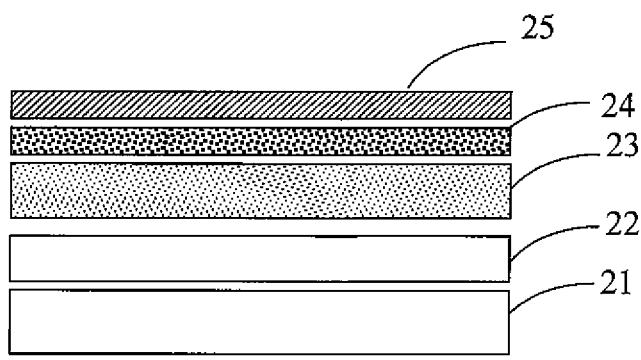
FIG. 3 is a structural schematic view of an organic electroluminescence device comprising the conjugated polymer containing dithienopyrrole-quinoxaline prepared in Example 1 as an active layer.

Preparation of organic electroluminescence apparatus containing the polymer made in Example 1:

Referring to FIG. 3, an organic electroluminescence apparatus containing the polymer made in Example 1 is shown, the apparatus includes a glass substrate 21, a transparent anode 22, a luminescent layer 23, a buffer layer 24 and a cathode 25 in a stacked structure. The transparent anode 22 may be made from Indium Tin Oxide (abbreviated as ITO), preferably from the Indium Tin Oxide with the sheet resistance of 10-20Ω/□. The luminescent layer 23 includes the polymer prepared in the Example 1. The buffer layer 24 may be made from, but not limited to, LiF and the like. The cathode 25 may be Al and the like, but not limited thereto. Therefore, in a particular embodiment, the organic electroluminescence apparatus may be represented by the structure: ITO/the polymer made in Example 1/LiF/Al. Each of the layers may be made by the exiting method, and the polymer made in Example 1 may be formed on the ITO by spin coating. The LiF buffer layer may be vacuum evaporated on the luminescent layer, and the metal Al may be evaporated on the buffer layer and used as a cathode of the apparatus.

Application Example 14

Figure 4:
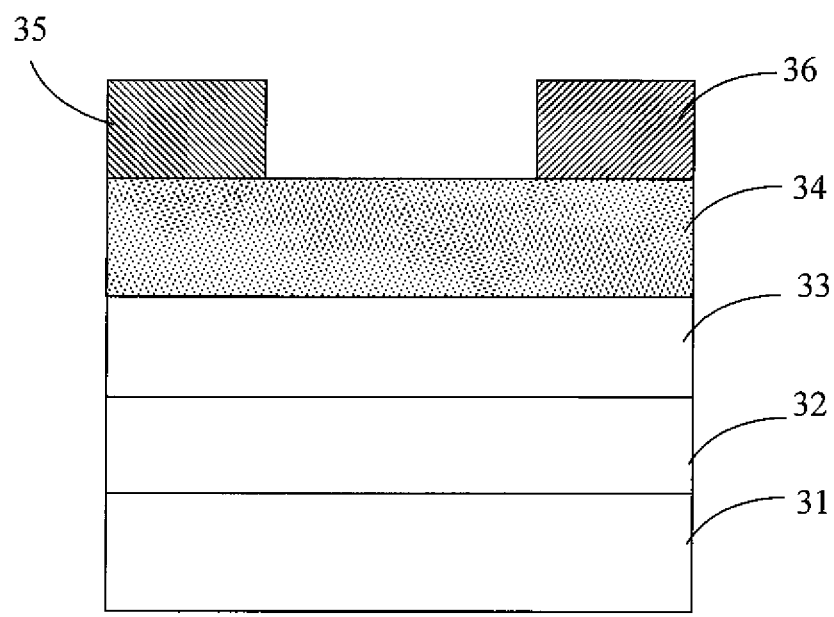
FIG. 4 is a structural schematic view of an organic field effect transistor device comprising the conjugated polymer containing dithienopyrrole-quinoxaline prepared in Example 1 as an organic semiconductor layer.

Preparation of organic field effect transistor containing the polymer made in Example 1:

Referring to FIG. 4, the organic field effect transistor contains a substrate 31, an insulating layer 32, a modifying layer 33, an organic semi-conductor layer 34 and a source electrode 35 and a drain electrode 36 disposed on the organic semi-conductor layer 34 in a stacked structure. Wherein the substrate 31 may be, but not limited to heavy doped silicon (Si), the insulating layer 32 may be, but not limited to, $SiO_2$ with the thickness of micro-nanometer (e.g., 450 nm). The organic semi-conductor layer 34 is made of the polymer prepared in Example 1. Both of the source electrode 35 and the drain electrode 36 may be made from aurum, but not limited thereto. The modifying layer 33 may be, but not limited to, octadecyl trichlorosilane (OTS). Each of the substrate 31, the insulating layer 32, the modifying layer 33 and the source electrode 35 and the drain electrode 36 may be made by the exiting method. The organic semi-conductor layer 34 may be made by spin coating the polymer prepared in the Example 1 on the insulating layer 32 modified by modifying layer 33.

The embodiments above are merely the preferable embodiments of the present invention and not intended to limit the present invention. And all changes, equivalent substitution and improvements which come within the meaning and range of equivalency of the present invention are intended to be embraced therein.

What is claimed is:

1. A conjugated polymer containing dithienopyrrole-quinoxaline, the general structural formula thereof is formula (I) as follows:

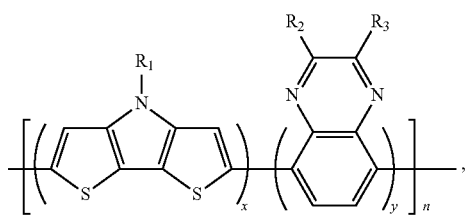

(I)

wherein, x+y=1, 0<y≤0.05, n is an integer and 1<n≤100, $R_1$ is selected from $C_1$~$C_{20}$ alkyl, $R_2$ and $R_3$ are independently selected from the group consisting of fluorenyl group containing alkyl and carbazyl group containing alkyl.

2. The conjugated polymer containing dithienopyrrole-quinoxaline of claim 1, wherein the general structural formula of the fluorenyl group containing alkyl is as follows:

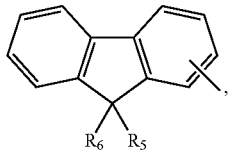

wherein $R_5$ and $R_6$ are the same or different, and they are independently $C_1$~$C_{15}$ alkyl, the general structural formula of the carbazyl group containing alkyl is as follows:

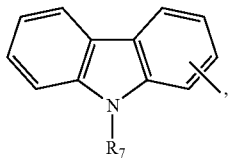

wherein $R_7$ is $C_1$~$C_{15}$ alkyl.

* * * * *